United States Patent

Yen

[11] Patent Number: 5,852,725
[45] Date of Patent: Dec. 22, 1998

[54] PCI/ISA BUS SINGLE BOARD COMPUTER CARD/CPU CARD AND BACKPLANE USING EISA BUS CONNECTORS AND EISA BUS SLOTS

[76] Inventor: Juei-Hsiang Yen, 4F-1, No. 5, Lane 33, Sec. 6, Hsin-Yi Road, Taipei, Taiwan

[21] Appl. No.: 644,235

[22] Filed: May 10, 1996

[51] Int. Cl.[6] .................................................. G06F 13/00
[52] U.S. Cl. ........................... 395/282; 395/281; 439/60; 361/784
[58] Field of Search ................................... 395/281, 282; 439/60, 65; 361/784, 785

[56] References Cited

U.S. PATENT DOCUMENTS

| | | | |
|---|---|---|---|
| 5,036,481 | 7/1991 | Lunsford et al. | 361/686 |
| 5,403,208 | 4/1995 | Felcman et al. | 439/633 |
| 5,426,739 | 6/1995 | Lin et al. | 395/309 |
| 5,440,755 | 8/1995 | Hariver et al. | 395/800 |
| 5,558,522 | 9/1996 | Dent | 439/65 |
| 5,611,057 | 3/1997 | Pecone et al. | 395/282 |
| 5,619,723 | 4/1997 | Jones et al. | 395/823 |

*Primary Examiner*—Gopal C. Ray

[57] ABSTRACT

A PCI/ISA bus single board computer card using EISA bus connectors and an EISA bus backplane slot for transmitting PCI bus and ISA bus signals. The computer card comprises EISA bus connectors having a first group of connectors interleaved with a second group of connectors. The first group of connectors transmit ISA bus signals and has a structure identical to conventional ISA bus connectors. The second group of connectors transmit PCI bus signals. The backplane comprises a plurality of PCI bus slots, a plurality of ISA bus slots and at least one EISA bus slot. Each slot comprises a plurality of clamping connectors. Each of the clamping connectors of the EISA bus slot has an upper part and a lower part. The upper part connects to a slot of the ISA bus and lower part connects to a slot of the PCI bus through the backplane circuit. By plugging the single board computer card into an EISA bus slot, the PCI bus signals are sent to PCI bus slots and the ISA bus signals are sent to ISA bus slots through the EISA bus connectors and the backplane. The single board computer card has the same length as that of an ISA slots. Both the area of the computer card and the size of computer system are reduced.

2 Claims, 4 Drawing Sheets

PCI/ISA BUS SINGLE BOARD COMPUTER CARD/CPU CARD AND BACKPLANE USING EISA BUS CONNECTORS AND EISA BUS SLOTS

FIELD OF THE INVENTION

The present invention relates to a bus structure and connectors (golden fingers) for a single board computer card/CPU card, more specifically to the EISA bus structure and connectors (golden fingers) for a PCI/ISA bus single board computer card/CPU card.

BACKGROUND OF THE INVENTION

In a computer system that contains a single board computer card, the computer card and a backplane work together to serve the function of a regular motherboard of a computer system. The circuit board of a single board computer card looks like a typical add-on card of a computer system. Nevertheless, the board comprises a CPU and all the system circuits of a regular computer motherboard. A backplane which has many slots for accepting add-on cards, provides connections between the add-on cards and the CPU through the backplane bus. The single board computer card plugs into one of the slots, transmits data and controls other add-on peripheral devices. Several types of bus standards have been developed for computer systems. In personal computers, an industry standard architecture (ISA) bus, an enhanced industry standard architecture (EISA) bus, a peripheral component interconnect (PCI) bus and a Video Electronics Standards Association (VESA) bus are the four standard buses commonly used.

The ISA bus is the most popular one for the personal computers. It has a long history and there are many add-on cards designed to work with an ISA bus. In an ISA bus, 16 bit data are communicated. The EISA bus was developed to enhance the capability of an ISA bus. It can transmit 32 bit data. An EISA bus comprises a structure having two interleaved groups of connectors. One group has signals and connectors identical to those of an ISA bus. The other group provides extra signals and connectors. The length of an ISA bus slot is the same as that of an EISA bus slot. The PCI bus is a relatively new bus standard. It is also a 32 bit data bus. Because of the popularity of the PCI bus in recent years, it has been an important trend for computer manufacturers to provide both an ISA bus and a PCI bus.

In a conventional PCI/ISA bus single board computer, the PCI bus connectors are extended along the ISA bus connectors. FIG. 1 shows the connectors of such a single board computer card. A single board computer card 1 has a group of connectors 11 for the ISA bus and a group of connectors 12 for the PCI bus. The two groups of connectors line up with each other. The corresponding backplane also adds a PCI bus slot behind an ISA bus slot. As shown in FIG. 2, a backplane 2 includes a plurality of ISA bus slots 21 and a plurality of PCI bus slots 22. A couple of PCI bus slots 22 are positioned behind ISA bus slots 21. The single board computer card can be connected to the backplane by having ISA bus connectors 11 plugged into an ISA slot 21 and PCI bus connectors plugged into a PCI bus slot 22 along the same line. Although the method of arranging the bus slots and connectors provide both the ISA bus and the PCI bus for the computer, it increases the minimum lengths of both the backplane and the single board computer card. With this conventional structure, a PCI/ISA bus single board computer card must be longer than an ISA bus slot plus a PCI bus slot. The increased length also increases the size of the computer card and the overall volume of the computer system.

SUMMARY OF THE INVENTION

The present invention has been made to overcome the above drawback of a conventional PCI/ISA bus single board computer card. The object of this invention is to provide a new mechanism for connecting a PCI/ISA bus single board computer card and its backplane by using EISA connector so that the length of the single board computer need not be increased. According to this invention, the PCI/ISA single board computer card is built with EISA bus connectors. The EISA bus connectors comprise two interleaved groups of connectors. A first group of the EISA bus connectors are used for ISA bus signals and connectors. A second group of the EISA bus connectors are used for PCI bus signals and connectors. The backplane of this invention comprises ISA bus slot, EISA bus slots and PCI bus slots. The signals of the ISA bus slots are connected to the first group of the EISA bus slots and the signals of the PCI bus slots are connected to the second group of the EISA bus slots. When the PCI/ISA single board computer card with EISA connector is inserted into the EISA slots, it can use both ISA and PCI add-on cards. Therefore, the present invention reduces the lengths of both the PCI/ISA bus single board computer card and the backplane. The volume of the computer is decreased.

DETAILED DESCRIPTION OF THE PREFERRED EMBODIMENTS

Figure 1:
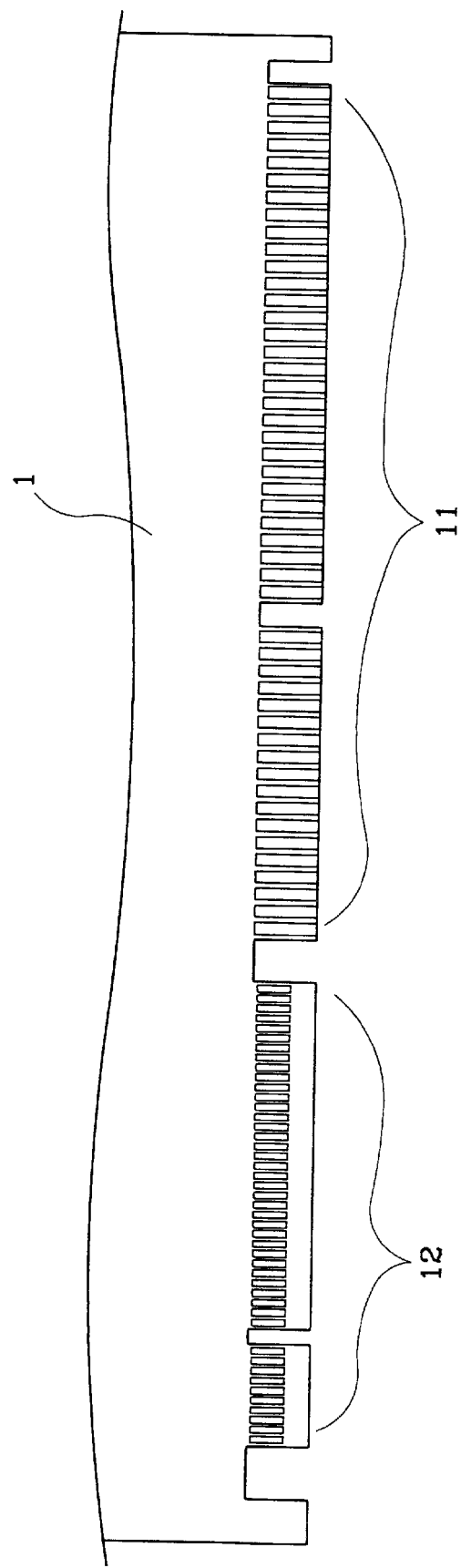
FIG. 1 shows the connectors of a conventional PCI/ISA single board computer card.
Figure 2:
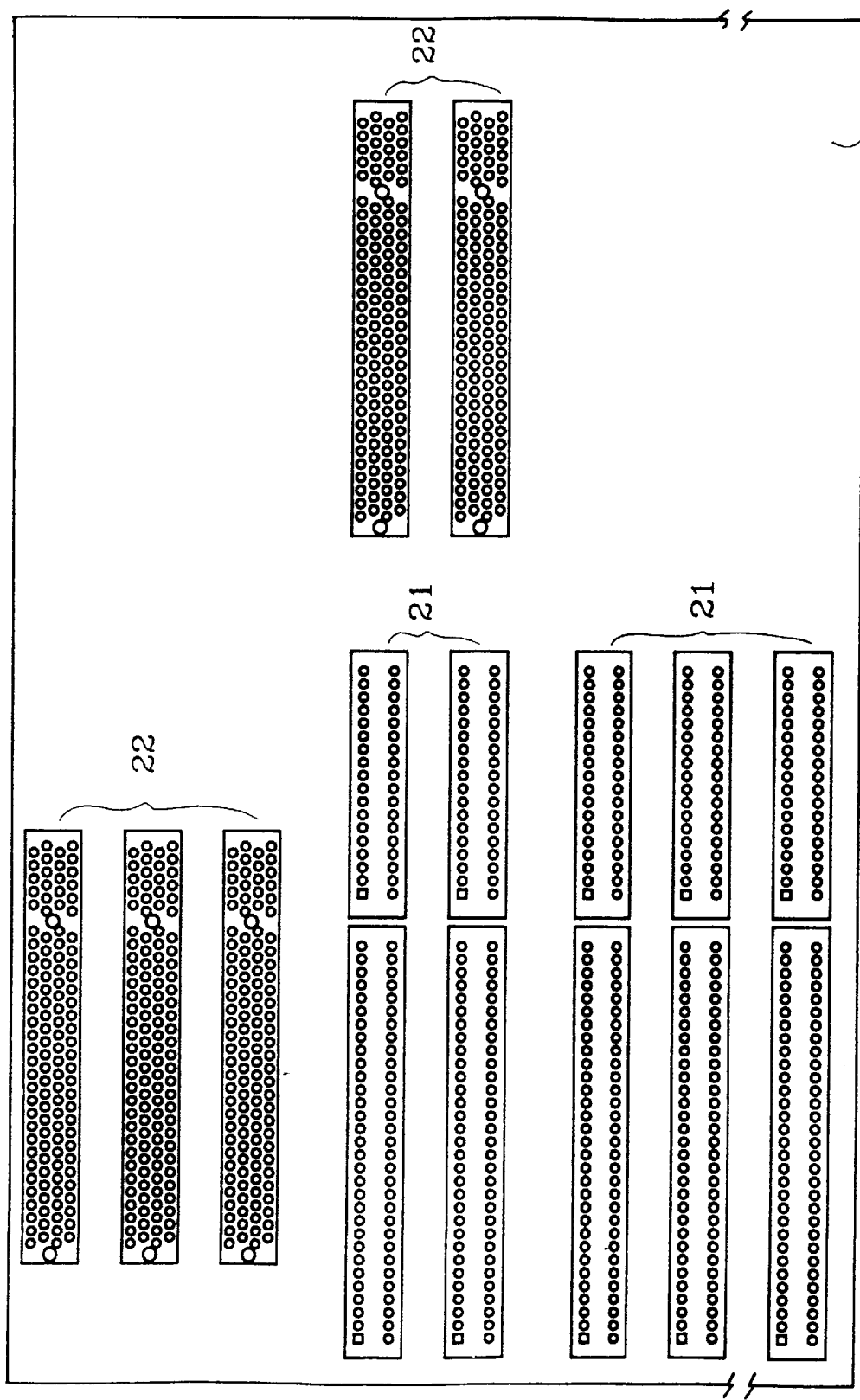
FIG. 2 shows the slots of a conventional PCI/ISA single board computer backplane.
Figure 3:
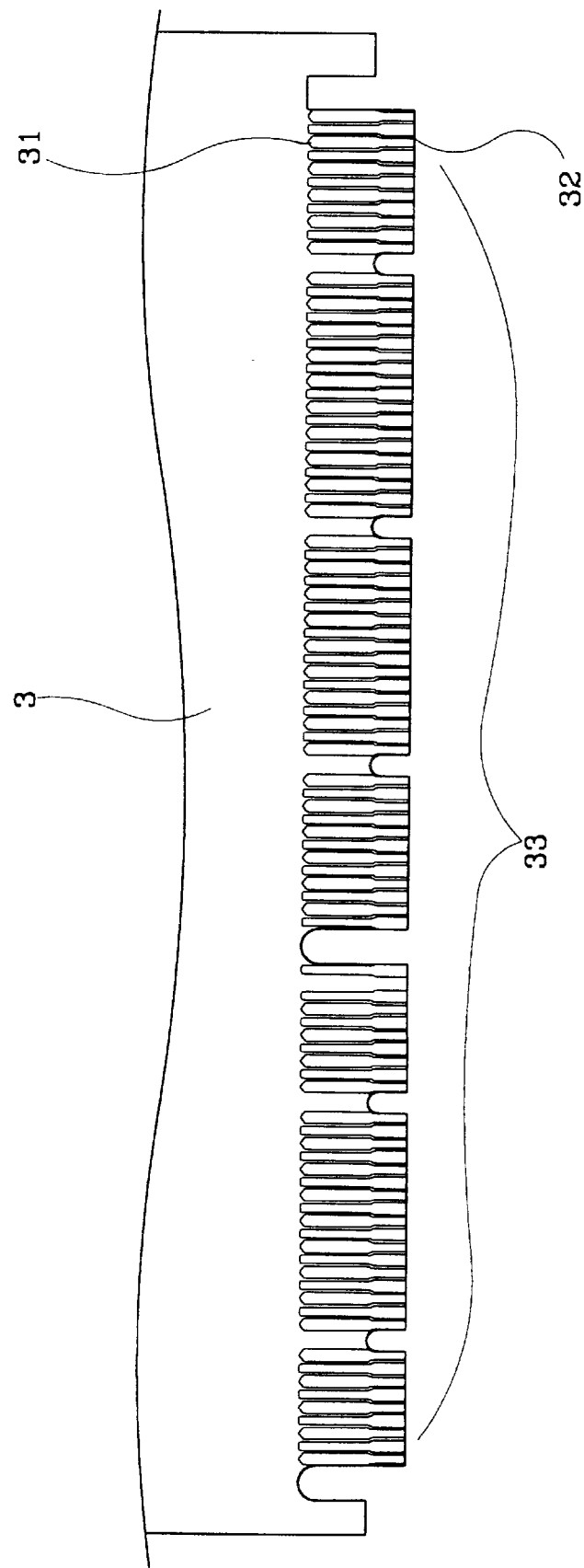
FIG. 3 shows the connectors of the PCI/ISA single board computer card of this invention.

With reference to FIG. 3, the single board computer card 3 of the present invention has an 80486/Pentium or other CPU. According to the invention, EISA bus type interface connectors (golden finger) 33 are built to the computer card. As shown in FIG. 3, the connectors 33 comprise two interleaved groups of connectors 31 and 32. In the first group of the connectors 31, each connector has a wider upper part and a narrower lower part. The structure is identical to that of an ISA bus connector. All ISA bus signals from the single board computer circuit are routed to the first group of connectors 31. A second group 32 of connectors are interleaved with the first group 31. Contrary to the connectors of the first group, each of the second group has a narrower upper part and a wider lower part. All PCI bus signals from the single board computer circuit are connected to the second group of connectors 32.

Figure 4:
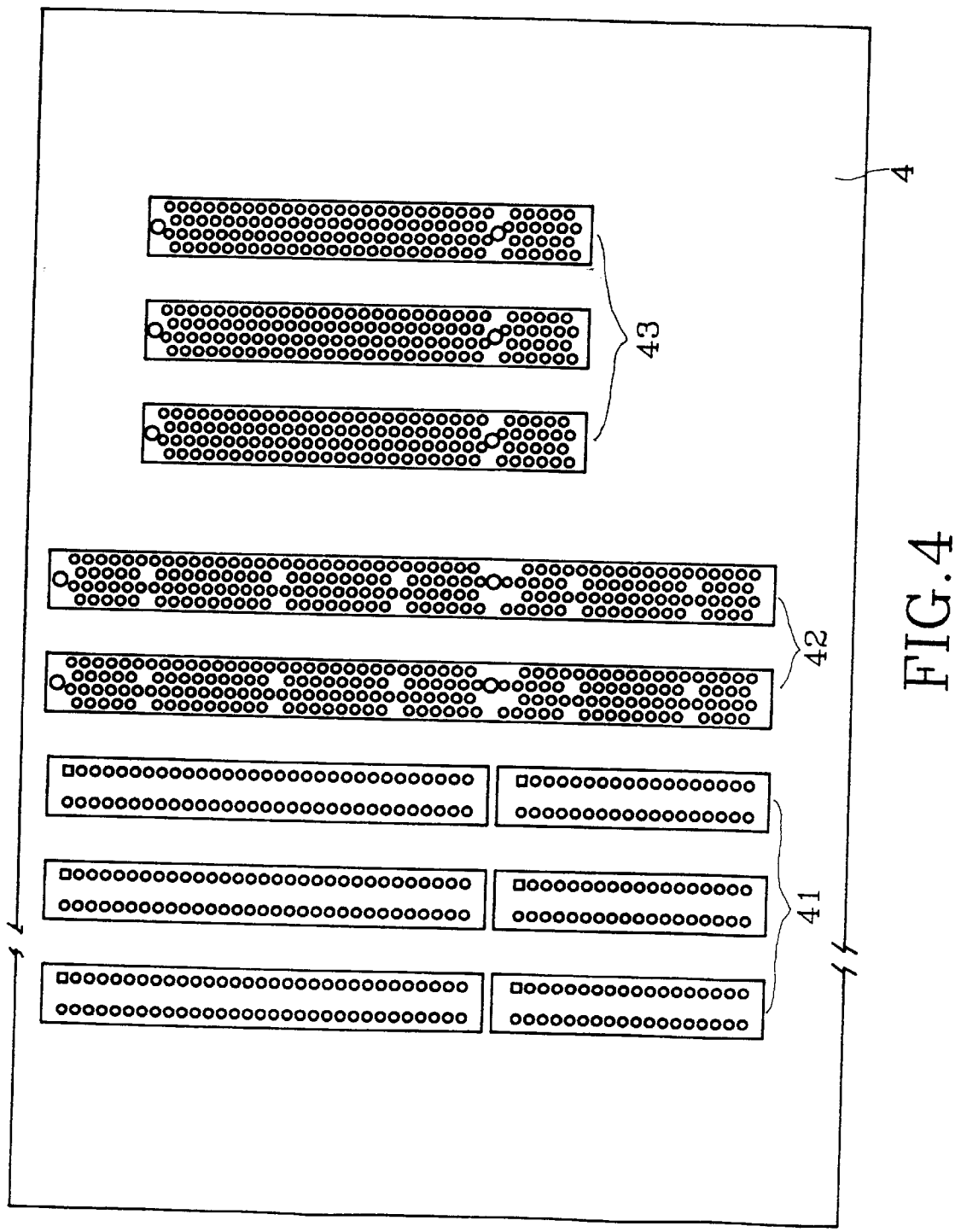
FIG. 4 shows the slots of the PCI/ISA single board computer backplane of this invention.

The backplane 4 of this invention is shown in FIG. 4. There are three types of slots on the backplane. A plurality of ISA bus slots 41, a plurality of EISA bus slots 42, and a plurality of PCI bus slots 43 are built on the backplane 4. Each slot can hold an add-on card tightly with a clamping mechanism. The clamping mechanism of the EISA bus slot 42 has a plurality of clamping connectors comprising an upper part and a lower part. When it holds the single board computer card 3, the upper part connects to an EISA bus connector 31 and the lower part connects to an EISA bus connector 32. As shown in FIG. 4, each EISA slot 42 has four rows of connection points on the backplane. The connection points on the first and the third rows connect to the lower part of the clamping connectors of the EISA bus slot 42. They are also connected to the clamping connectors of the PCI bus slots 43. When the single board computer card 3 is plugged into an EISA bus slot, the signals of the PCI bus on the computer card are routed to the second group of EISA bus connectors 32 and transmitted to the PCI bus on the backplane through the lower part of the clamping connectors. The connection points of the second and the fourth rows connect to the upper part of the clamping connectors of the EISA bus slot 42. They are also connected to the clamping connectors of the ISA bus slots 41. Similarly, when the single board computer card 3 is plugged into an EISA bus slot, the signals of the ISA bus on the computer card are routed to the first group of connectors 31 and transmitted to the ISA bus on the backplane through the upper part of the clamping connectors.

As described above, this invention presents a unique structure for the PCI/ISA single board computer card. By using an EISA bus type connectors for the computer card and an EISA bus slot on the backplane, both PCI bus and ISA bus signals can be connected to the backplane and other add-on cards. There is no need to add PCI connectors behind the ISA connectors on the computer card. It is not necessary to have a PCI bus slot along the line of an ISA bus slot either. Therefore, both the single board computer card and the backplane can have lengths no longer than the length of an ISA bus slot. The total length of slots on the backplane of this invention is not more than that of the conventional backplane for a single board computer. The size of the PCI/ISA single board computer card and the backplane can be made smaller. The total volume of the computer can also be reduced.

Although only the preferred embodiments of this invention were shown and described in the above description, it is requested that any modification or combination that comes within the spirit of this invention be protected.

What is claimed is:

1. A backplane for a single board computer system having both PCI bus and ISA bus comprising:
    a plurality of PCI bus slots, each of said PCI bus slots having a plurality of clamping connectors for PCI bus data paths and each corresponding data path being connected together;
    a plurality of ISA bus slots, each of said ISA bus slots having a plurality of clamping connectors for ISA bus data paths and each corresponding data path being connected together; and
    at least one EISA bus slot having a plurality of clamping connectors including an upper part and a lower part, said EISA bus slot having a first row, a second row, a third row and a fourth row of connection points on said backplane, each connection point of said first and third rows being connected to the lower part of one of said clamping connectors and each connection point of said second and fourth rows being connected to the upper part of one of said clamping connectors;
    wherein each connection point of said first and third rows is connected to one of said PCI bus clamping connectors and each connection point of said second and fourth rows is connected to one of said ISA bus clamping connectors.

2. A single board computer system comprising:
    a single board computer card having a PCI bus transmitting PCI bus signals, an ISA bus transmitting ISA bus signals, and a plurality of EISA bus connectors, said connectors including a first group of connectors interleaved with a second group of connectors, each of said first group connectors carrying said ISA bus signals and having a wider upper part and a narrower lower part and each of said second group connectors carrying said PCI bus signals and having a narrower upper part and a wider lower part; and
    a backplane having a plurality of PCI bus slots, each of said PCI bus slots including a plurality of clamping connectors for PCI bus data paths and each corresponding data path being connected together; a plurality of ISA bus slots, each of said ISA bus slots having a plurality of clamping connectors for ISA bus data paths and each corresponding data path being connected together; and at least one EISA bus slot having a plurality of clamping connectors including an upper part and a lower part, said EISA bus slot having a first row, a second row, a third row and a fourth row of connection points on said backplane, each connection point of said first and third rows being connected to the lower part of one of said EISA bus clamping connectors and to one of said PCI bus clamping connectors; and each connection point of said second and fourth rows being connected to the upper part of one of said EISA bus clamping connectors and to one of said ISA bus clamping connectors;
    wherein said single board computer card is plugged into one of said EISA bus slot of said backplane, said first group connectors of said single board computer card connect the ISA bus of said computer card to said ISA bus slots of said backplane; and said second group connectors of said single board computer card connect the PCI bus of said computer card to said PCI bus slots of said backplane.

* * * * *